United States Patent
Anderson et al.

(10) Patent No.: US 7,078,722 B2
(45) Date of Patent: Jul. 18, 2006

(54) NFET AND PFET DEVICES AND METHODS OF FABRICATING SAME

(75) Inventors: Brent A. Anderson, Jericho, VT (US); Louis D. Lanzerotti, Burlington, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,453

(22) Filed: Sep. 20, 2004

(65) Prior Publication Data

US 2006/0060856 A1    Mar. 23, 2006

(51) Int. Cl.
*H01L 29/76* (2006.01)
(52) U.S. Cl. ........................................ 257/19; 257/347
(58) Field of Classification Search .................. 257/18, 257/19, 347, 353
See application file for complete search history.

(56) References Cited

U.S. PATENT DOCUMENTS

| | | | |
|---|---|---|---|
| 6,630,710 B1 | 10/2003 | Augusto | |
| 6,646,322 B1 | 11/2003 | Fitzgerald | |
| 6,674,100 B1 | 1/2004 | Kubo et al. | |
| 6,677,192 B1 | 1/2004 | Fitzgerald | |
| 6,707,106 B1 | 3/2004 | Wristers et al. | |
| 6,717,216 B1 | 4/2004 | Doris et al. | |
| 6,723,661 B1 | 4/2004 | Fitzergald | |
| 2001/0045604 A1* | 11/2001 | Oda et al. | 257/350 |
| 2002/0109135 A1 | 8/2002 | Murota et al. | |
| 2002/0179946 A1 | 12/2002 | Hara et al. | |
| 2003/0027393 A1 | 2/2003 | Suguro | |
| 2003/0094637 A1 | 5/2003 | Awano | |
| 2003/0102490 A1 | 6/2003 | Kubo et al. | |
| 2003/0219937 A1 | 11/2003 | Peterson et al. | |
| 2004/0026736 A1 | 2/2004 | Grupp et al. | |
| 2004/0061772 A1 | 4/2004 | Furukawa et al. | |
| 2004/0113174 A1 | 6/2004 | Chidambarrao et al. | |
| 2004/0113217 A1 | 6/2004 | Chidambarrao et al. | |

\* cited by examiner

*Primary Examiner*—Thomas L. Dickey
(74) *Attorney, Agent, or Firm*—Schmeiser, Olsen & Watts; William D. Sabo (57) ABSTRACT

A field effect transistor and method of fabricating the field effect transistor. The field effect transistor, including: a gate electrode formed on a top surface of a gate dielectric layer, the gate dielectric layer on a top surface of a single-crystal silicon channel region, the single-crystal silicon channel region on a top surface of a Ge including layer, the Ge including layer on a top surface of a single-crystal silicon substrate, the Ge including layer between a first dielectric layer and a second dielectric layer on the top surface of the single-crystal silicon substrate.

18 Claims, 9 Drawing Sheets

NFET AND PFET DEVICES AND METHODS OF FABRICATING SAME

FIELD OF THE INVENTION

The present invention relates to the field of field effect transistors (FETs); more specifically, it relates to high-mobility p-channel field effect transistors (PFETs) and methods of fabricating high-mobility PFETs.

BACKGROUND OF THE INVENTION

Complimentary metal-oxide-silicon (CMOS) technology is used in many integrated circuits. CMOS technology utilizes n-channel metal-oxide-silicon field effect transistors (n-MOSFETs) often shortened to NFETs and p-channel metal-oxide-silicon field effect transistors (p-MOSFETs) often shortened to PFETs. Conventional NFETs and PFETs are well known in the art and comprise a source region and a drain region on opposite sides of a channel region formed in single-crystal silicon with a gate electrode formed on top of a gate dielectric layer which is itself formed on top of the channel region.

When NFETs and PFETs are used in high performance circuits, the PFETs need to be larger than the NFETs to overcome the difference in carrier mobility between NFETs and PFETs so as not to let the PFETs limit overall circuit switching speed. The hole mobility in PFETs is about 25% that of the electron mobility of NFETs. Larger PFETs require more silicon area and more power in a time when modern integrated circuits need to be smaller and consume less power in very many applications.

Therefore there is a need for both an improved PFET with high switching speed at reduced silicon area and power consumption compared to conventional PFETs and an NFET that may be fabricated simultaneously with the improved PFET.

SUMMARY OF THE INVENTION

The present provides both an improved PFET with high switching speed at reduced silicon area and power consumption compared to conventional PFETs by inducing stress in the PFET channel as well as an NFET that may be fabricated simultaneously with the improved PFET.

A first aspect of the present invention is a field effect transistor, comprising: a gate electrode formed on a top surface of a gate dielectric layer, the gate dielectric layer on a top surface of a single-crystal silicon channel region, the single-crystal silicon channel region on a top surface of a Ge comprising layer, the Ge comprising layer on a top surface of a single-crystal silicon substrate, the Ge comprising layer between a first dielectric layer and a second dielectric layer on the top surface of the single-crystal silicon substrate.

A second aspect of the present invention is a method of fabricating a field effect transistor comprising: (a) providing a single-crystal silicon substrate having a single-crystal Ge comprising layer formed on a top surface of the single-crystal silicon substrate and a single-crystal silicon layer formed on a top surface of the single-crystal Ge comprising layer; (b) forming a gate dielectric layer on a top surface of the single-crystal silicon layer; (c) forming a gate electrode on a top surface of the dielectric layer; (d) removing the single-crystal silicon layer to form a single crystal-silicon island and removing a less than whole portion of the single-crystal Ge comprising layer to form an island of single-crystal silicon under the gate electrode where the single-crystal silicon layer and the single-crystal Ge comprising layer are not protected by the gate electrode; (e) oxidizing an entire remaining portion of the single-crystal Ge comprising layer not protected by the gate electrode, and a less than whole portion of the single-crystal Ge comprising layer under the gate electrode to form a single-crystal Ge comprising island under the single-crystal silicon island and having a first dielectric layer on a first side and a second dielectric layer on second and opposite side of the single-crystal Ge comprising island, the first dielectric layer and the second dielectric layer each extending under the gate electrode; and (f) forming a polysilicon source region over the first dielectric layer and forming a polysilicon drain region over the second dielectric layer, the polysilicon source region and the polysilicon drain region abutting opposite sides of the single-crystal silicon channel island.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
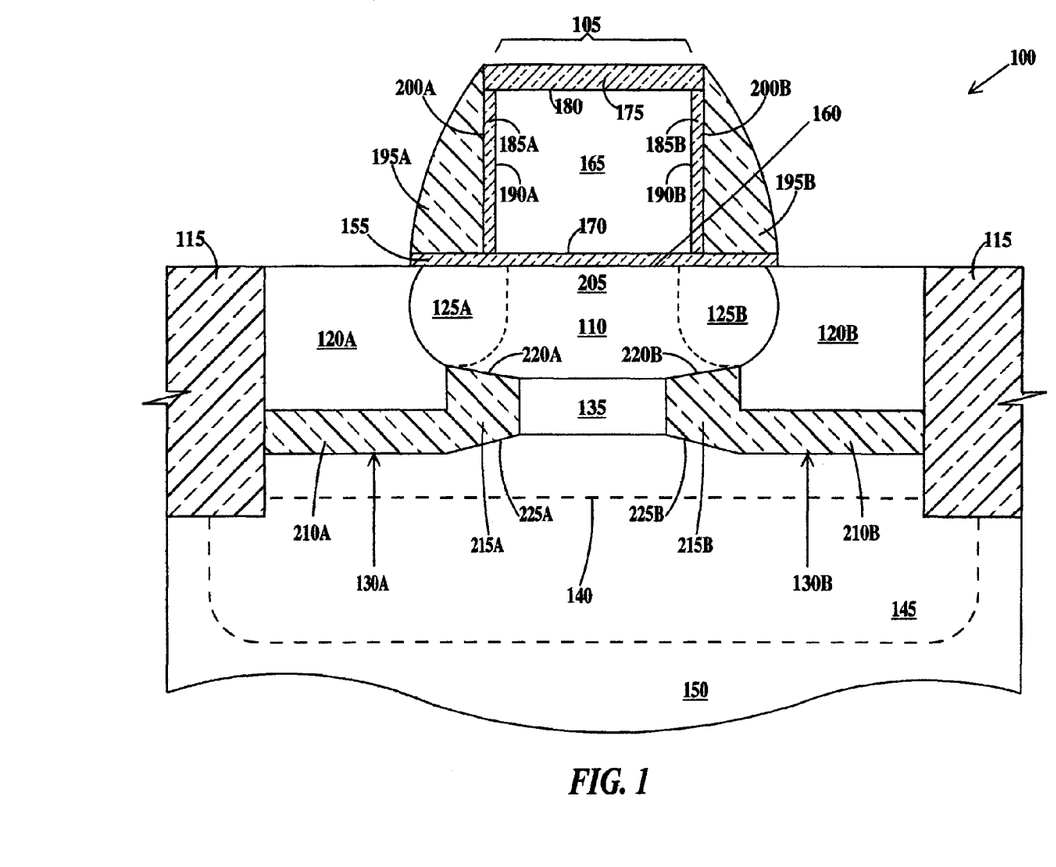
FIG. 1 is a cross-sectional view of a PFET 100 according to the present invention.

FIG. 1 is a cross-sectional view of a PFET 100 according to the present invention. FIG. 1 is a cross-section along the channel length direction of PFET 100. In FIG. 1, PFET 100 includes a gate 105; an N-doped single-crystal silicon region 110 under gate 105, a P-doped polysilicon source region 120A abutting shallow trench isolation (STI) 115 (that bounds PFET 100 but is technically not part of PFET 100); a single-crystal silicon source region 125A extending into single-crystal silicon region 110 (bounded by the dashed lines) and extending under gate 105; a P-doped polysilicon drain region 120B abutting STI 115; and a P-doped single-crystal silicon drain region 125B abutting polysilicon drain region 120B and extending into single-crystal silicon region 110 (bounded by the dashed lines) and extending under gate 105. PFET 100 further includes a buried dielectric layer 130A under polysilicon source region 120A and single-crystal silicon source region 125A and extending from STI 115 to under gate 105; and a buried dielectric layer 130B under drain region 120B and single-crystal silicon drain region 125B and extending from STI 115 to under gate 105. PFET 100 still further includes a single-crystal Ge comprising layer 135 under single-crystal silicon region 110 and extending between buried dielectric layers 130A and 130B; an N-well 145 under buried dielectric layers 130A and 130B and Ge comprising layer 135; and a retrograde N-type ion-implant peak 140 in a single-crystal silicon N-well 145 (in a silicon substrate 150) under buried dielectric layers 130A and 130B and Ge comprising layer 135 and bounded by STI 115.

It should be understood that polysilicon source region 120A and single-crystal silicon source region 125A are physically and electrically in contact and structurally and electrically comprise the source of PFET 100. Likewise, it should be understood that polysilicon drain region 120B and single-crystal silicon drain region 125B are physically and electrically in contact and structurally and electrically comprise the drain of PFET 100.

Gate 105 includes a gate dielectric layer 155 on a top surface 160 of single-crystal silicon region 110 and a P-doped or undoped polysilicon gate electrode 165 on a top surface 170 of gate dielectric layer 155 and a capping layer 175 on a top surface 180 of gate electrode 165. Optional sidewall insulation layers 185A and 185B are formed on opposing sidewalls 190A and 190B respectively of gate electrode 165 and dielectric spacers 195A and 195B are formed on outer surfaces 200A and 200B respectively of corresponding sidewall insulation layers 185A and 185B. Gate dielectric layer 155 is illustrated in FIG. 1 extending under spacers 195A and 195B. Alternatively, gate dielectric layer may extend partially or not at all under spacers 195A and 195B.

A channel region 205 is defined in single-crystal silicon region 110. Channel region 205 may include a portion of adjacent to top surface 160 of substrate 150 between single-crystal silicon source region 125A and single-crystal silicon drain region 125B or channel region 205 may include all of single-crystal silicon region 110 between single-crystal silicon source region 125A and single-crystal silicon drain region 125OB. Single-crystal silicon region 110 extends under spacers 195A and 195B as illustrated in FIG. 1 or may extend under and past spacers 195A and 195B toward STI 115.

Buried dielectric layer 130A includes a first region 210A and a second region 215A. Second region 215A is thicker than first region 210A. First region 210A extends under polysilicon source region 120A from STI 115 to meet second region 215A under spacer 195A. Second region 215A extends from first region 210A from under spacer 195A to Ge comprising layer 135 under gate 105.

Buried dielectric layer 130B includes a first region 210BA and a second region 215B. Second region 215B is thicker than first region 210B. First region 210B extends under polysilicon drain region 120B from STI 115 to meet second region 215B under spacer 195B. Second region 215B extends from first region 210B from under spacer 195A to Ge comprising layer 135 under gate 105.

A top surface 220A of second region 215A slopes upward (toward surface 160 of substrate 150) from Ge comprising layer 135 to meet polysilicon source region 120A under spacer 195A. A bottom surface 225A of second region 215A slopes downward (away from surface 160 of substrate 150) from Ge comprising layer 135 to meet first region 210A under spacer 195A. A top surface 220B of second region 215B slopes upward from Ge comprising layer 135 to meet polysilicon drain region 120B under spacer 195B. A bottom surface 225B of second region 215B slopes downward from Ge comprising layer 135 to meet first region 210B under spacer 195B.

The upward slope of top surface 220A of second region 215A of buried dielectric layer 130A and of top surface 220B of second region 215B of buried dielectric layer 130B which is in the order of 50% percent from flat (relative to top surface 160 of substrate 150) imparts a stress of about 50 mega-pascals to about 1000 mega-pascals to the crystal lattice of single-crystal silicon region 110 and channel region 205. Stress on silicon the silicon lattice of PFETs has been shown to increase the hole mobility and thus the drain current of the PFET which can be advantageously used to reduce the silicon area of a PFET required for a given PFET drain current rating.

Figure 2A:
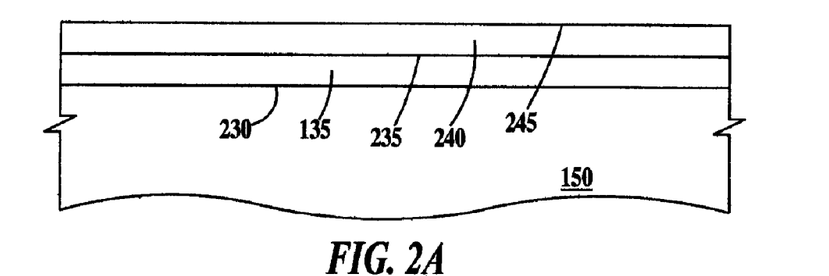
FIGS. 2A through 2P are cross-sectional views illustrating fabrication of PFET 100 of FIG. 1.

FIGS. 2A through 2P are cross-sectional views illustrating fabrication of PFET 100 of FIG. 1. In FIG. 2A, single-crystal silicon substrate 150 has a Ge comprising layer 135 formed on a top surface 230 of a single-crystal silicon substrate 150 and a single-crystal silicon layer 240 formed on a top surface 235 of Ge comprising layer 135. Single-crystal silicon substrates are also called mono-crystalline silicon substrates or bulk silicon substrates. In a first example, Ge comprising layer 135 comprises $Si_{(1-X)}Ge_X$ where X equals about 0.15 to about 0.5. In a second example, Ge comprising layer 135 comprises $Si_{(1-X-Y)}Ge_XC_Y$ where X equals about 0.15 to about 0.5 and Y equals about 0 to about 0.1. A single-crystal SiGe layer may be epitaxially formed by low pressure chemical vapor deposition (LPCVD) using $SiH_4$ and $GeH_4$. A single-crystal SiGeC layer may be epitaxially formed by LPCVD using a combination of $SiH_4$, $GeH_4$ and $CH_3SiH_3$ or $C_2H_6$. In one example Ge comprising layer 135 is about 10 nm to about 100 nm thick. A single-crystal silicon layer may be epitaxially formed by LPCVD using $SiH_4$ and/or $H_2$. In one example single-crystal silicon layer 240 is about 5 nm to about 50 nm thick.

Figure 2B:
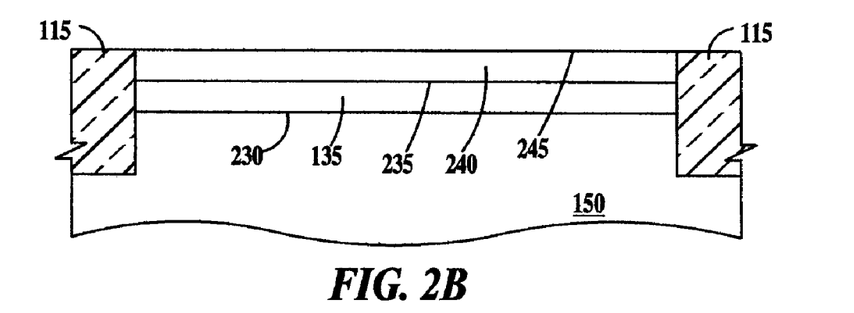

In FIG. 2B, STI 115 is formed. STI 115 extends from a top surface 245 of single-crystal silicon layer 240 through single-crystal silicon layer 240, through single-crystal Ge comprising layer 135 into substrate 150. STI 115 may be formed by reactive ion etching (RIE) trenches through single-crystal Ge comprising layer 135 into substrate 150, depositing an insulator such as $SiO_2$ or tetraethoxysilane (TEOS) oxide to fill the resultant trench and chemical-mechanical polishing (CMP) down to top surface 245 of single-crystal silicon layer 240 to remove excess insulator.

Figure 2C:
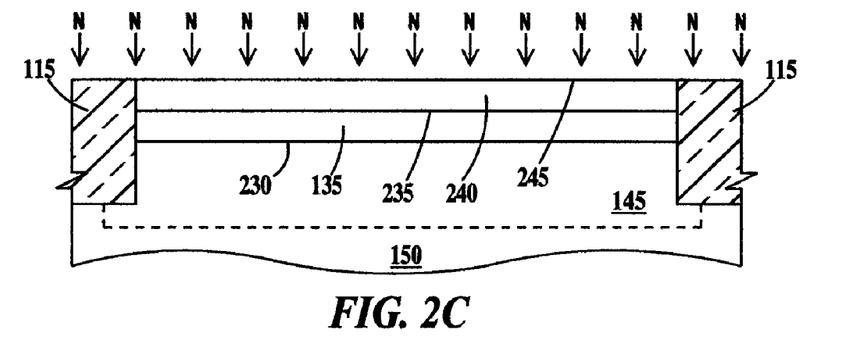

In FIG. 2C, N-well 145 is formed in substrate 150 by ion implantation of an N-dopant such as arsenic or phosphorus. While N-well 145 is illustrated as extending below STI 145, N-well 145 may be about even with or shallower than the STI.

Figure 2D:
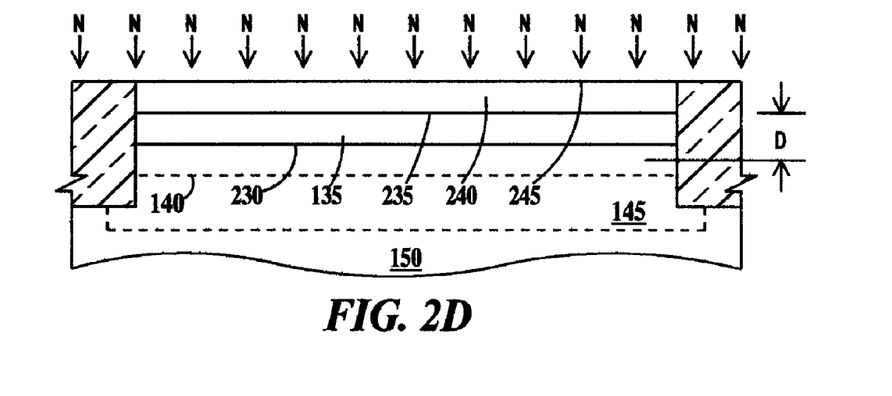

In FIG. 2D, a retrograde ion implantation is performed using an N-dopant such as arsenic. A retrograde ion implant is defined as an ion implant having a peak concentration below a surface of the material into which the ion implantation is performed. Peak 140 of the retrograde ion implant is located a distance D below top surface 235 of Ge comprising layer 240.

Figure 2E:
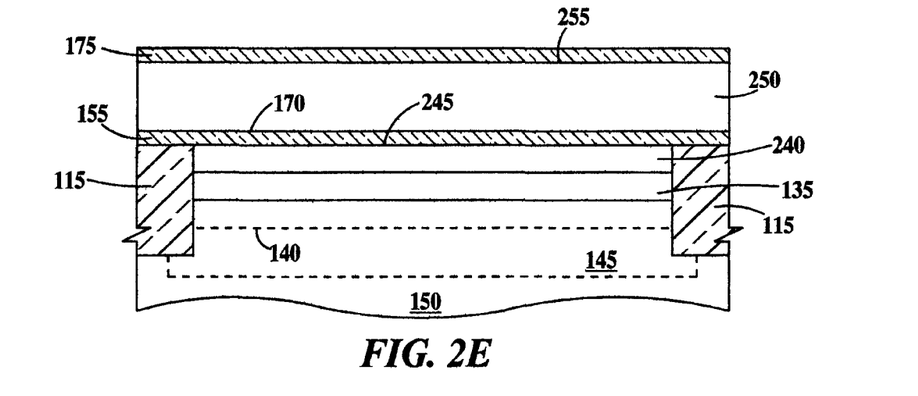

In FIG. 2E, gate dielectric layer 155 is formed on top surface 245 of single-crystal silicon layer 240. In one example, gate dielectric layer 155 comprises deposited or thermal $SiO_2$, but may be any gate dielectric known in the art. An N-doped or undoped polysilicon layer 250 is formed on top surface 170 of gate dielectric layer 155. Polysilicon may be formed by CVD using $SiH_4$ (and optionally $AsH_4$ or $PH_4$ if the gate is to be doped at this point in the fabrication). Capping layer 175 is formed on a top surface 255 of polysilicon layer 250. In one example, capping layer 175 comprises a TEOS oxide layer over a thermal $SiO_2$ layer.

Figure 2F:
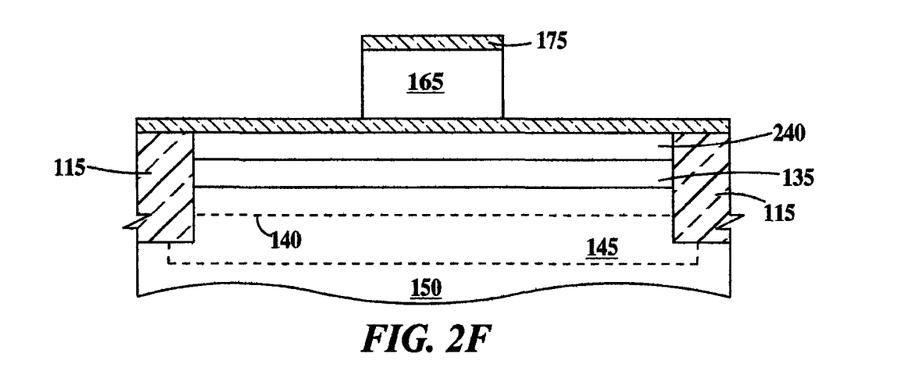

In FIG. 2F, a photolithography process is performed and capping layer 175 is patterned and used as a hard mask to etch away undesired portions of polysilicon layer 250 (see FIG. 2E) to form gate electrode 165 under remaining capping layer 175.

Figure 2G:
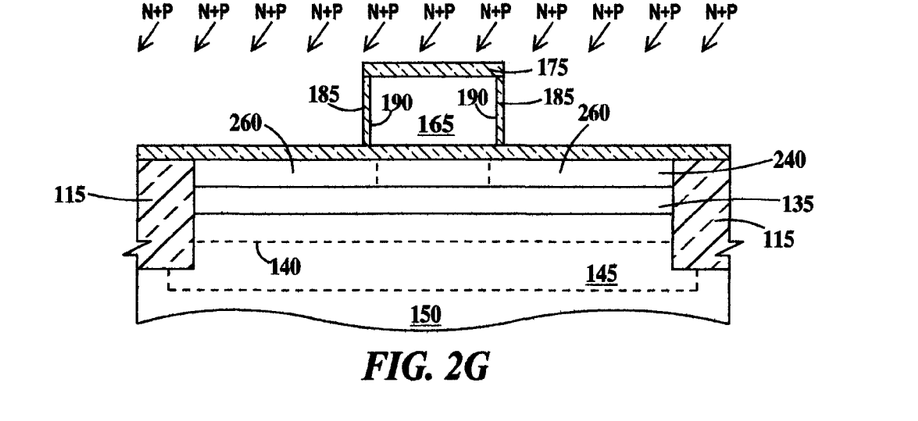

In FIG. 2G an optional sidewall isolation layer 185 is formed on sidewalls 190 of gate electrode 165. Then an optional P-dopant extension ion implant using, for example, boron and/or an optional N-dopant halo ion implant using, for example, arsenic is performed to form extension/halo regions 260 in single-crystal silicon layer 240. Extension and halo implants may be performed at an angle of other than 90° relative to top surface 245 of single-crystal silicon layer 240. The halo and extension implants are performed such that, while they extend under gate electrode 165, they will not extend as far as thick regions 215A and 215B of respective buried dielectric layers 130A and 130B extend under the gate electrode (see FIG. 1). The halo and extension implants are shallow implants and do not extend below Ge comprising layer 135.

Alternatively, the extension and/or halo ion implants may be performed after formation of gate electrode 165 but before formation of sidewall isolation layer 185.

Figure 2H:
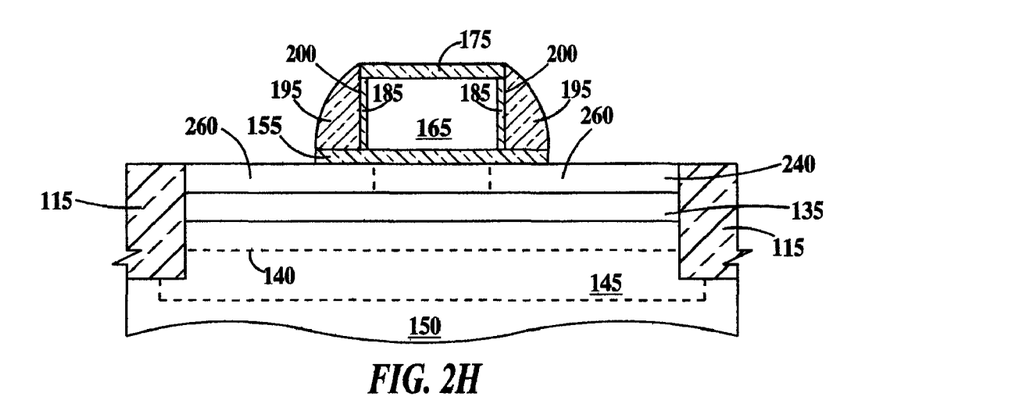

In FIG. 2H, spacers 195 are formed on outer surfaces 200 of sidewall insulation layer 185. Spacers 195 may comprise $Si_3N_4$, $SiO_2$, or combinations thereof. For example, spacers 195 may comprise a multiple overlaid spacers, each spacer formed from either $SiO_2$ and $Si_3N_4$. Further, one or both of the halo and extension ion implants discussed supra, may be alternatively, performed after formation of spacers 195. Spacers are formed by depositing a conformal layer of material and then performing an RIE process. Gate dielectric layer 155, not protected by gate electrode 165 and spacers 195 may also be removed by the RIE process or another process.

Figure 2I:
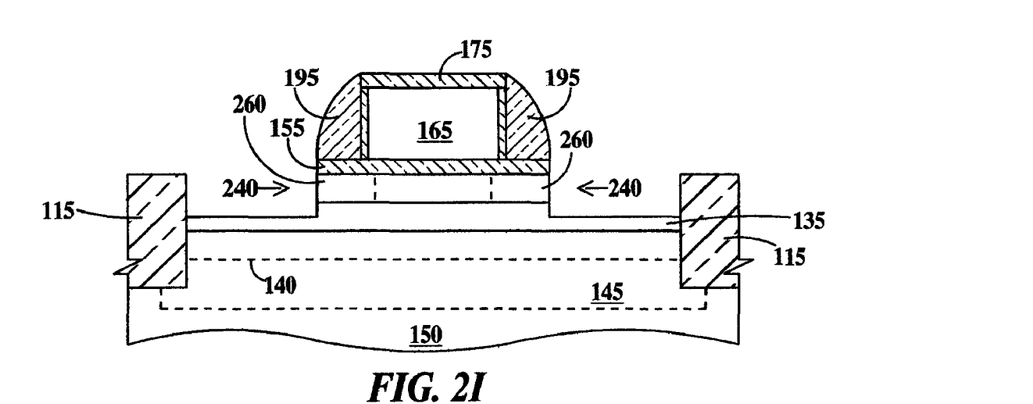

In FIG. 2I, portions of single-crystal silicon layer 240 not protected by gate electrode 165 and spacers 195 are removed. Also Ge comprising layer 135 is etched to recess the Ge comprising layer in regions where single-crystal silicon layer 240 were removed, so that Ge comprising layer 135 is thinner in these regions than under gate electrode 165 and spacers 195. In one example, Ge comprising layer 135 is thinned to half its original thickness where not protected by gate electrode 165 and spacers 195. In a second example, Ge comprising layer 135 is thinned to between about 5 nm to about 50 nm where not protected by gate electrode 165 and spacers 195. The etching of single-crystal silicon layer 240 and Ge comprising layer 135 may be accomplished using an RIE process that selectively etches Si, SiGe and SiGeC relative to the material of capping layer 175, spacers 195, and STI 115. In the example that capping layer 175 spacers 195 and STI 115 are forms of silicon oxide, a suitable RIE process would utilize a mixture of $CF_4$ and $O_2$.

Figure 2J:
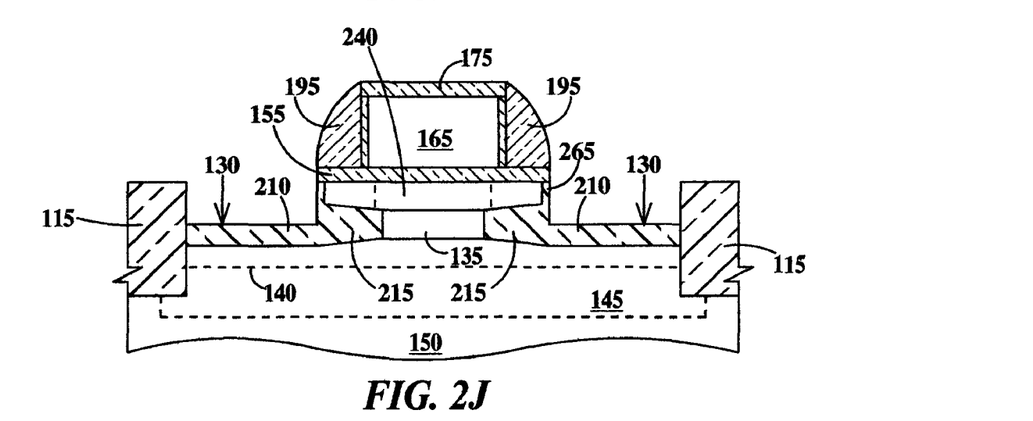

In FIG. 2J, Ge comprising layer 135 is oxidized to form buried dielectric layer 130 which comprises oxides of Si and Ge. In one example, an oxidation at about 600° C. or less using a mixture of $H_2O$ vapor and $O_2$ is performed. Under these conditions, single-crystal SiGe and single-crystal SiGeC oxidize about 40 times faster than single-crystal silicon. During oxidation, the volume of the oxidized SiGe or SiGeC about doubles with about 40% of the volume being below the original surface and about 60% of the volume being above the original surface. Also, Ge comprising layer 135 oxidizes horizontally under spacers 195 and gate electrode 165 a distance equal to the thickness of oxidized SiGe or SiGeC formed where Ge comprising layer 135 was not protected by gate electrode 165 and spacers 195. It should also be remembered that Ge comprising layer 135 was thicker under spacers 195 and gate electrode 165 than where the Ge comprising layer was exposed. Therefore, buried dielectric layer 130 includes a thick region 215 under spacers 195 and extending partially under gate electrode 165 and a thin region 210 where buried dielectric layer 130 is not under spacers 195 and gate electrode 165. In one example, thin region 210 of buried dielectric layer 130 is about 10 nm to about 100 nm thick, thick region 215 of buried dielectric layer 130 is about 10 nm to about 200 nm thick and extends under spacers 195 about 10 nm to about 200 nm.

After the oxidation, the only remaining Ge comprising layer 135 is an island under gate electrode 165. Also a thin layer of $SiO_2$ 265 is formed on exposed edges of single-crystal silicon layer 240. A effect of the oxidation process is that regions of single-crystal silicon layer 240 between thick region 215 of buried dielectric layer 130 and gate dielectric layer 155 under spacers 195 are strained, that is, the crystal lattice is distorted from normal.

Figure 2K:
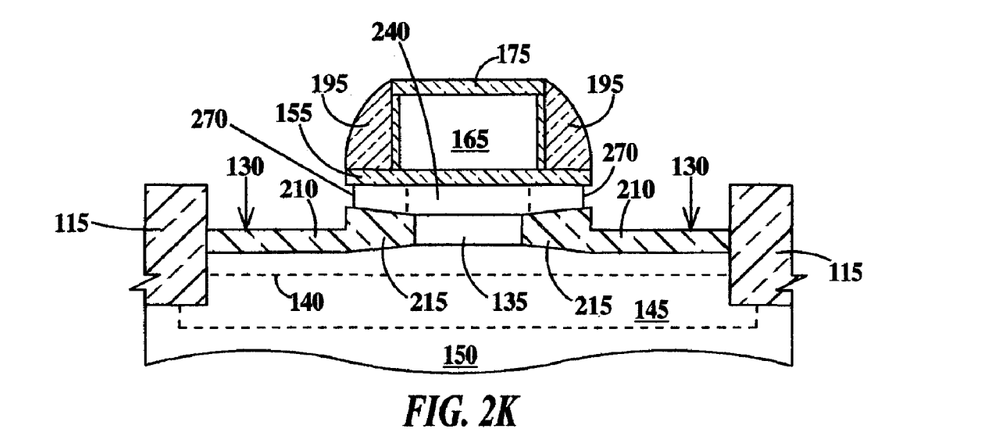

In FIG. 2K, thin layer of $SiO_2$ 265 (see FIG. 2J) is removed to expose edges 270 of single-crystal silicon region 240.

Figure 2L:
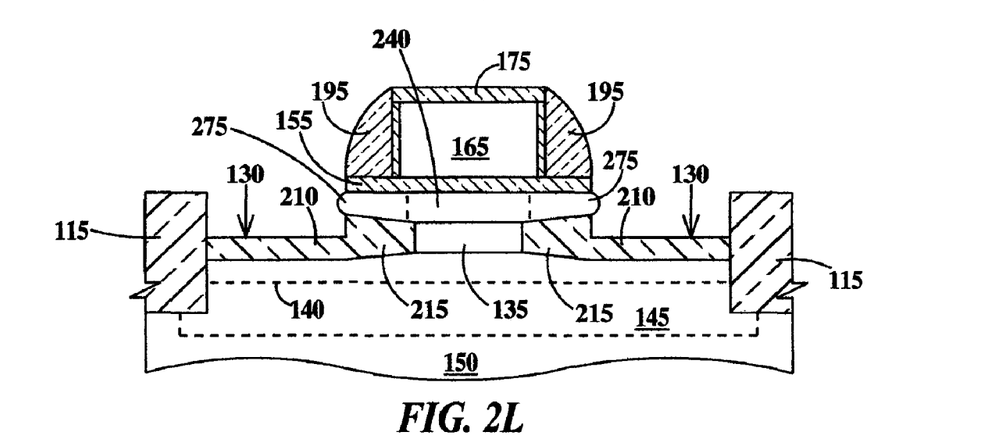

In FIG. 2L, epitaxial silicon regions 275 are grown on edges 270 (see FIG. 2K) of single-crystal silicon region 240. As described supra, epitaxial Si may be grown by LPCVD using $SiH_4$.

Figure 2M:
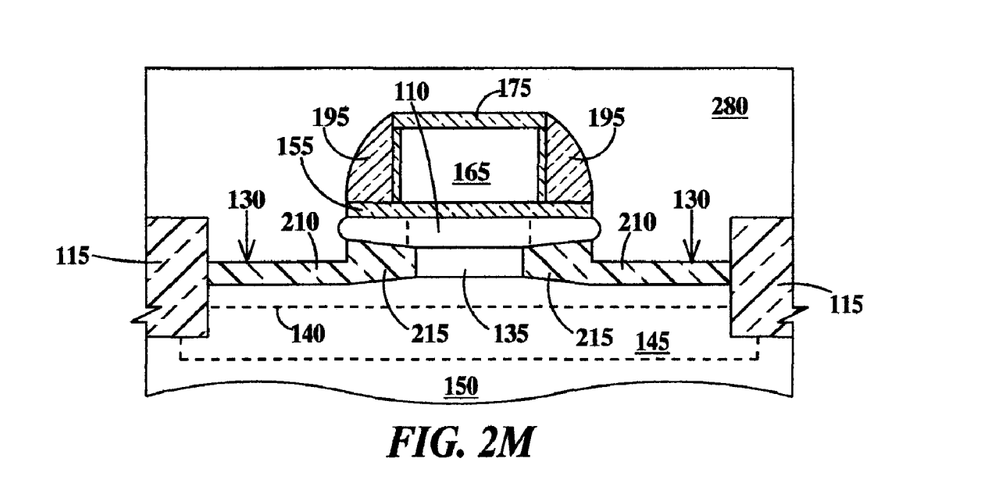

In FIG. 2M, a polysilicon layer 280 is formed of sufficient thickness to cover capping layer 175 and spacers 195. As described supra, polysilicon layer 280 may be doped P-type or undoped. Epitaxial regions 275 on single-crystal silicon layer 240 (see FIG. 2L) may increase in size slightly and single-crystal silicon region 110 results (see also FIG. 1).

Figure 2N:
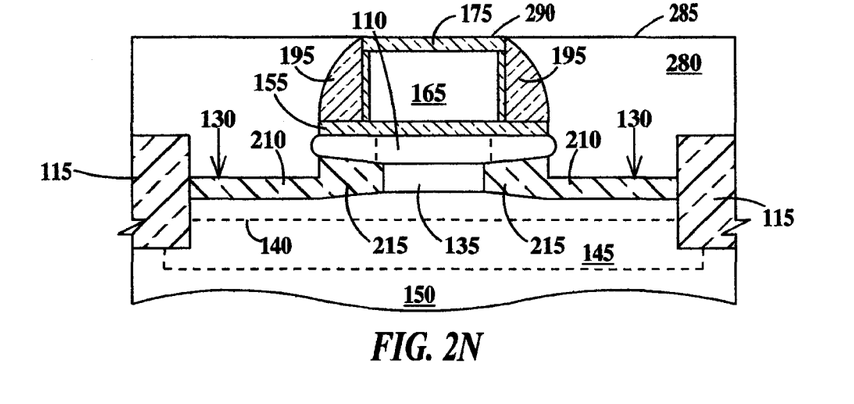

In FIG. 2N, a CMP process is performed so that a top surface 285 of polysilicon layer 280 is coplanar with a top surface 290 of capping layer 175.

Figure 2O:
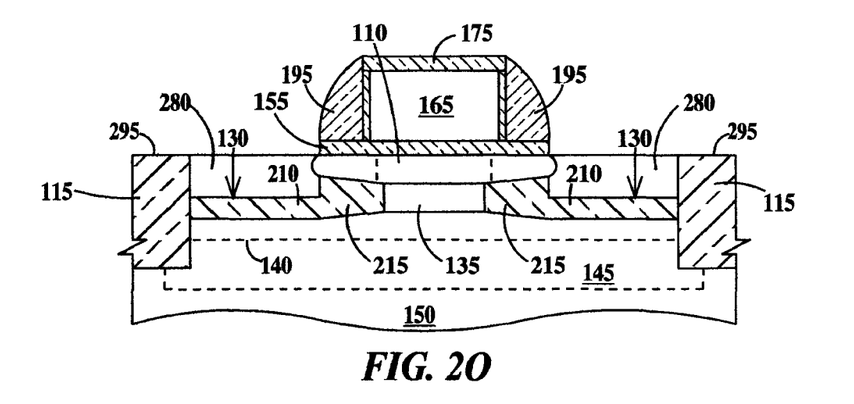

In FIG. 2O, a RIE etch back process is performed, so that polysilicon layer 280 (see FIG. 2N) is removed from spacers 195, exposed ends of gate dielectric layer 155 and atop surface 295 of STI 115. Polysilicon layer 280 remains in the space defined by single-crystal silicon region 110, buried dielectric layer 130 and STI 115.

Figure 2P:
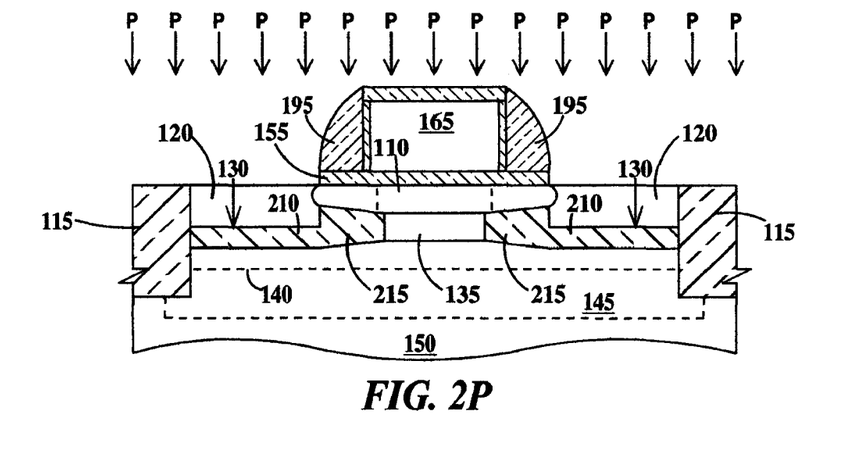

In FIG. 2P, an optional P-type (for example boron) ion implantation is performed to form P-doped polysilicon source/drains 120 in remaining polysilicon layer 280 (see FIG. 280). The P-type ion implant may also be used to dope gate electrode 165. If polysilicon layer 280 was P-doped as deposited, this P-type ion implantation may be eliminated or not depending upon whether it is desired to P-type ion implant gate electrode 165.

Returning to FIG. 1, the structure of PFET 100 improves several operational parameters of the PFET. First, the relatively shallow single-crystal silicon region 110 under gate electrode 165, particularly near sidewalls 190A and 190B of the gate electrode, result in improved short channel characteristics such as decreased sub-threshold voltage swing ($S_{SWING}$), decreased drain induced barrier loading, and more precise threshold voltage ($V_T$)control. Second, the relatively deep polysilicon source and drain regions 120A and 120B result in lower source/drain resistance. Third, buried dielectric layers 130A and 130B lower source/drain capacitance (compared to a conventional bulk silicon PFET). Fourth, Ge comprising layer 135 between second region 215A of buried dielectric layer 130A and second region 215B of buried dielectric layer 130B (because of the high Ge doping levels) allows control of $V_T$ by voltage biasing N-well 145. These improved operating parameters have been experimentally shown to result in a significantly faster PFET (when compared to a conventional bulk silicon PFET of about the same channel width and channel length as a PFET of the present invention) and results in up to about a 42% increase in drain region current at saturation ($I_{DSAT}$) on short channel length devices. Fabrication of a PFET according to the present invention is essentially complete.

FIGS. 3A through 3D are cross-sectional views illustrating fabrication of an NFET 300 (see FIG. 4) that may be fabricated alone or simultaneously with PFET 100 (see FIG.

1). by several changes to the PFET process described supra. Before describing these changes, it should be understood, that it is well known in the art, that when both PFETs and NFETs are being fabricated on the same substrate, that the PFETs are protected from ion implantation during ion implants required only for the NFETs and that NFETs are protected from ion implantation during ion implants required only for the PFETs. Often this protection is provided by a photo resist layer. Thus, it should be understood in the description that follows, that such steps have taken place relative to the PFET and that such steps would also have taken place relative to an NFET is the previous description of formation of a PFET if PFETs and NFETs are being simultaneously fabricated according to the present invention.

Fabrication of NFET 300 (see FIG. 4) alone or simultaneously with PFET 100 (see FIG. 1) is similar to the fabrication of PFET 100 (see FIG. 1) illustrated in FIGS. 2A through 2M and described supra, with the differences described immediately infra In FIG. 2C, N-well 145 is replaced by a P-Well formed by ion implantation of a P-dopant such as boron. In FIG. 2D, the N-doped retrograde ion implantation is replaced with a P-dopant retrograde ion implantation using a P-dopant species such as boron. In FIG. 2G, the P-dopant extension ion implantation is replaced with an N-dopant extension ion implantation using an N-dopant species such as arsenic and the optional N-dopant halo ion implantation is replaced with a P-dopant ion extension ion implantation using a P-dopant species such as boron.

Figure 3A:
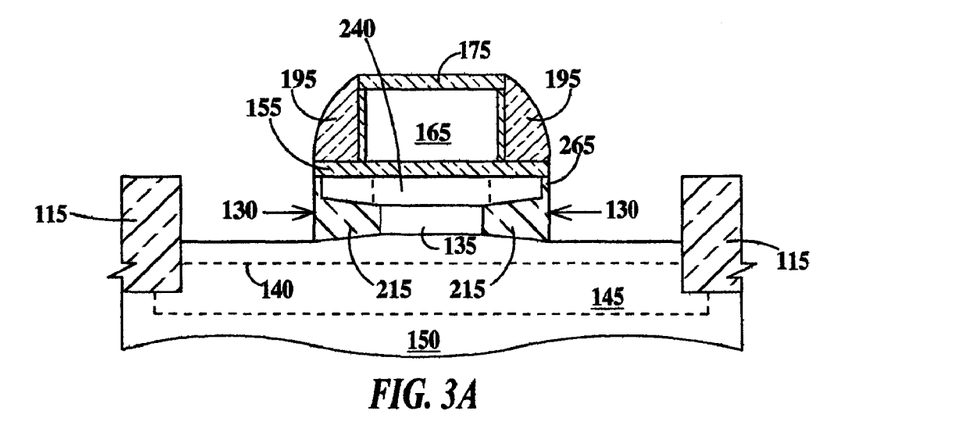
FIGS. 3A through 3D are cross-sectional views illustrating fabrication of an NFET 300 of FIG. 4 that may be fabricated alone or simultaneously with PFET 100 of FIG. 1.
Figure 3B:
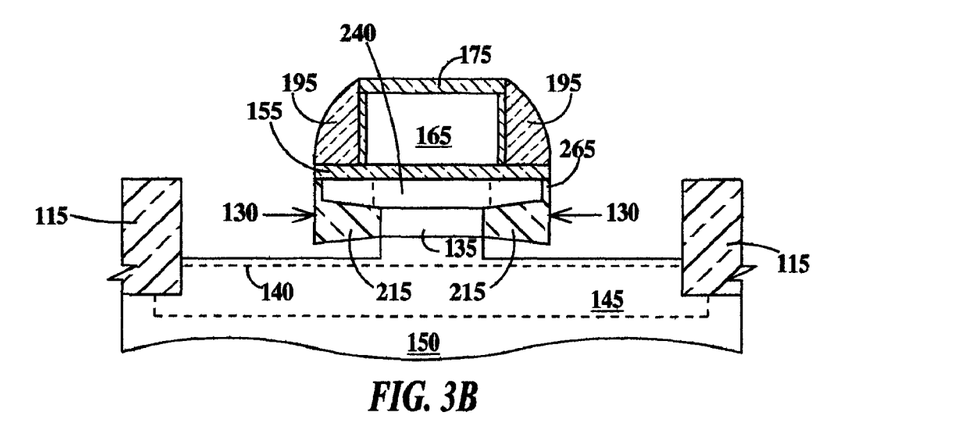

Between the processes illustrated in FIGS. 2I and 2J, the processes illustrated in FIGS. 3A and 3B are performed. In FIG. 3A, a directional RIE is performed to remove thin region 210 of buried dielectric layer 130 not protected by spacer 195, capping layer 175 and gate electrode 165. Also capping layer 175 may be alternatively formed from $Si_3N_4$ or layers of $Si_3N_4$ and $SiO_2$. In FIG. 3B, a isotropic silicon etch is performed to remove exposed portions of silicon substrate and undercut thick regions 215 of dielectric layer 130. STI 115 is not undercut. Removing silicon from under undercut thick regions 215 of dielectric layer 130 removes most or all of the stress previously induced into single-crystal silicon region 110 and channel region 205 (see FIG. 4).

Figure 3C:
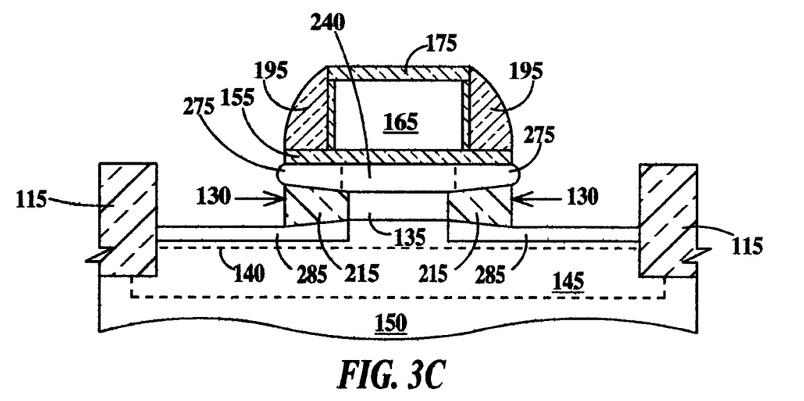
Figure 3D:
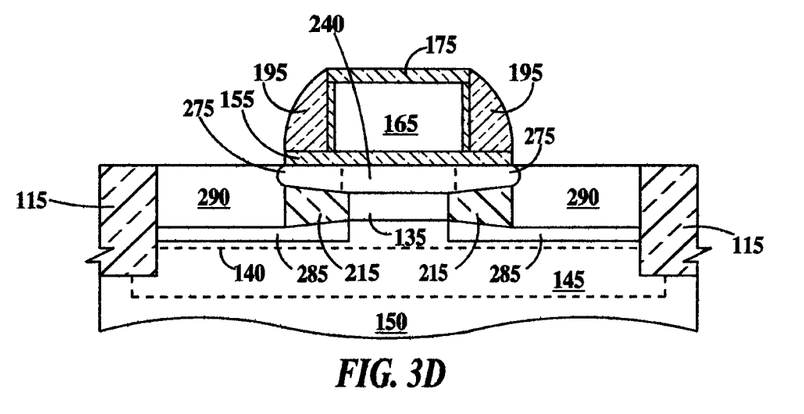

For an NFET, FIG. 2L is replaced with FIG. 3C and FIG. 20 is replaced with FIG. 3D. In FIG. 3C, epitaxial silicon regions 275 are grown on edges 270 (see FIG. 2K) of single-crystal silicon region 240 and an epitaxial layer 285 is grown on exposed surface of silicon substrate 215. As described supra, epitaxial Si may be grown by LPCVD using $SiH_4$. In FIG. 3D, a RIE etch back process is performed, so that polysilicon layer 280 (see FIG. 2N) is removed from spacers 195, exposed ends of gate dielectric layer 155 and a top surface 295 of STI 115. A polysilicon layer 290 remains in the space defined by single-crystal silicon region 110, thick region 215 of buried dielectric layer 130, epitaxial layer 285 and STI 115.

In FIG. 2P, the optional P-type ion implantation is replaced with an optional N-type ion implantation (for example using arsenic) to form N-doped source/drains 120. Fabrication of an NFET according to the present invention is essentially complete.

Figure 4:
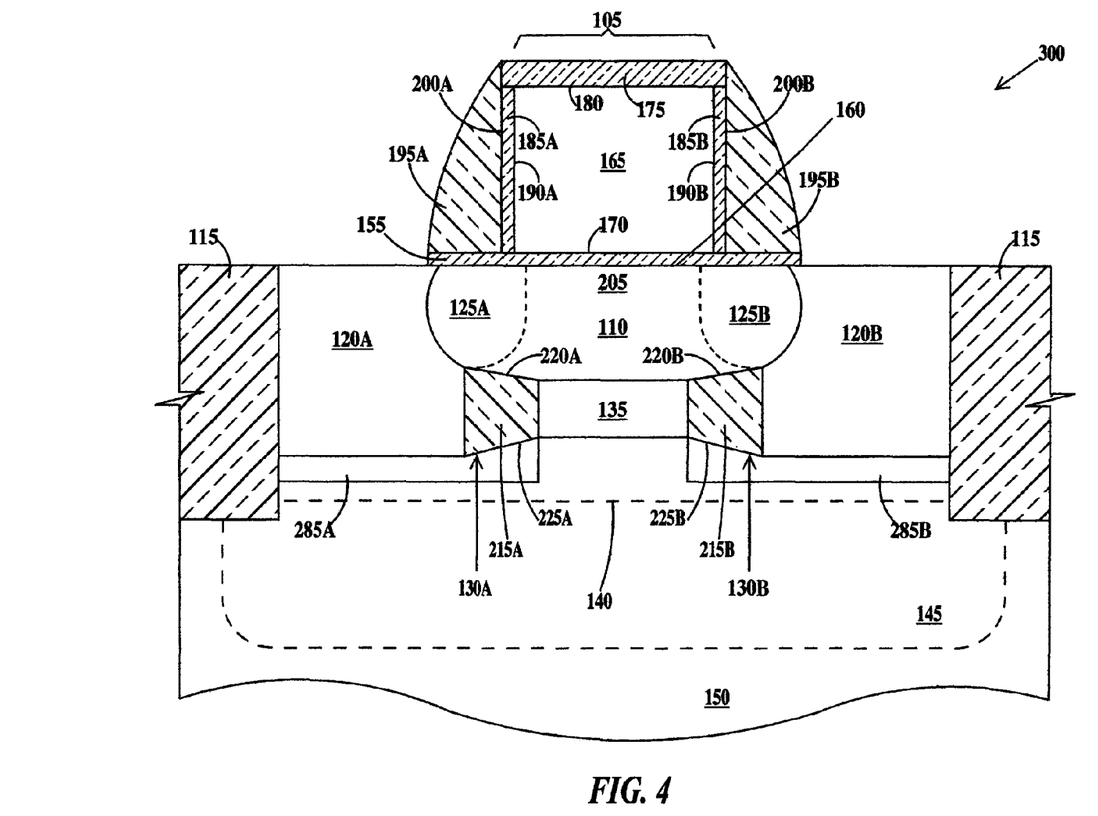
FIG. 4 is a cross-sectional view of NFET 300 that may be fabricated alone or simultaneously with PFET 100 of FIG. 1 according to the present invention.

FIG. 4 is a cross-sectional view of NFET 300 that maybe fabricated alone or simultaneously with the PFET 100 of FIG. 1, according to the present invention. FIG. 4 is similar to FIG. 1, except for several differences. First, single crystal region 110 is P-doped, instead of N-doped, source and drain regions 120A and 120B are N-doped instead of P-doped, single crystal regions 125A and be are N-doped instead of P-doped, N-well 145 is replaced with a P-well 145. Second, structurally, only thick regions 215A and 215B of respective dielectric layers 130A and 130B, epitaxial layers 285A and 285B intervene between respective polysilicon source/drain regions 120A and 120B and silicon substrate 150 rather than respective thin regions 210A and 210B (see FIG. 1) of dielectric layers 130A and 130B, and epitaxial layers 285A and 285B extend under respective thick regions 215A and 215B of dielectric layers 130A and 130B. Source/drain dopant species from source 120A and drain 120B may or may not extend into respective epitaxial layers 285A and 285B.

Thus the present invention provides both an improved PFET with high switching speed at reduced silicon area and power consumption compared to conventional PFETs and an NFET that may be fabricated simultaneously with the improved PFET.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A field effect transistor, comprising:
   gate electrode formed on a top surface of a gate dielectric layer, said gate dielectric layer on a top surface of a single-crystal silicon channel region, said single-crystal silicon channel region on a top surface of a Ge comprising layer, said Ge comprising layer on a top surface of a single-crystal silicon substrate, said Ge comprising layer between a first dielectric layer and a second dielectric layer on said top surface of said single-crystal silicon substrate, said first dielectric layer extending under a first side of said single-crystal silicon channel region and said second dielectric layer extending under a second and opposite side of said single-crystal silicon channel region.

2. The field effect transistor of claim 1, wherein said first dielectric layer extends under a first side of said gate electrode and said second dielectric layer extends under a second and opposite side of said gate electrode.

3. The field effect transistor of claim 1, wherein bottom surfaces of said first and second dielectric layers extend into said single-crystal silicon substrate past a bottom surface of said Ge comprising layer.

4. The field effect transistor of claim 1, wherein said Ge comprising layer comprises $Si_{(1-x)}Ge_x$ where X equals about 0.15 to about 0.5 or $Si_{(1-x-y)Ge_x}C_Y$ where X equals about 0.15 to about 0.5 and Y equals about 0 to about 0.1.

5. The field effect transistor of claim 1, wherein said first and second dielectric layers induce stress in the crystal lattice of said channel region.

6. The field effect transistor of claim 1, wherein said first dielectric layer and second dielectric layer each comprise oxides of silicon and oxides of germanium.

7. The field effect transistor of claim 1, further including:
   a P doped polysilicon source region and a P-doped polysilicon drain region, each abutting said single-crystal silicon channel region on opposite sides of said single-crystal silicon channel region; and a dielectric isolation abutting said polysilicon source and said polysilicon drain, said first and second dielectric layers extending, respectively, under said polysilicon source and said polysilicon drain and abutting said dielectric isolation.

8. The field effect transistor of claim 1, wherein said single-crystal silicon channel region is doped N-type.

9. The field effect transistor of claim 1, further including:
a polysilicon source region and a polysilicon drain region, each abutting said single-crystal silicon channel region on opposite sides of said single-crystal silicon channel region.

10. The field effect transistor of claim 9, wherein said first dielectric layer extends tinder said polysilicon source and said second dielectric layer extends under said polysilicon drain.

11. The field effect transistor of claim 10, wherein:
a first region of said first dielectric layer under said single-crystal silicon channel region has a first thickness and a second region of said first dielectric layer under said polysilicon source region has a second thickness, said first thickness greater than said second thickness; and
a first region of said second dielectric layer under said single-crystal silicon channel region has a first thickness and a second region of said second dielectric layer under said polysilicon drain region has a second thickness, said first thickness greater than said second thickness.

12. The field effect transistor of claim 9, wherein said first dielectric layer does not extend under said polysilicon source and said second dielectric layer does not extend under said polysilicon drain.

13. The field effect transistor of claim 9, further including:
a single-crystal silicon source region between said polysilicon source region and said single-crystal silicon channel region; and
a single-crystal silicon drain region between said polysilicon drain region and said single-crystal silicon channel region.

14. The field effect transistor of claim 13, wherein said single-crystal silicon source region and said single-crystal silicon drain region each extend under said gate electrode.

15. The field effect transistor of claim 13, wherein:
a first region of said first dielectric layer under said single-crystal silicon channel region has a first thickness and a second region of said first dielectric layer under said polysilicon source region has a second thickness, said first thickness greater than said second thickness;
a first region of said second dielectric layer under said single-crystal silicon channel region has a first thickness and a second region of said second dielectric layer under said polysilicon drain region has a second thickness, said first thickness greater than said second thickness;
said single-crystal silicon source region extends into said polysilicon source region past said first region or said first dielectric layer; and
said single-crystal silicon drain region extends into said polysilicon drain region past said first region of said second dielectric layer.

16. The field effect transistor of claim 15, wherein:
said single-crystal silicon source region does not extend into said single-crystal silicon channel region past said first region of said first dielectric layer; and
said single-crystal silicon drain region does not extend into said single-crystal silicon channel region past said first region of said second dielectric layer.

17. The field effect transistor of claim 9, further including:
an N doped polysilicon source region and an N-doped polysilicon drain region, each abutting said single-crystal silicon channel region on opposite sides of said single-crystal silicon channel region; and
a dielectric isolation abutting said polysilicon source and said polysilicon drain.

18. The field effect transistor of claim 9, wherein said single-crystal silicon channel region is doped P-type.

* * * * *

UNITED STATES PATENT AND TRADEMARK OFFICE
CERTIFICATE OF CORRECTION

PATENT NO. : 7,078,722 B2 Page 1 of 1
APPLICATION NO. : 10/711453
DATED : July 18, 2006
INVENTOR(S) : Anderson et al.

It is certified that error appears in the above-identified patent and that said Letters Patent is hereby corrected as shown below:

Column 3
Line 30, delete "1250B" and insert -- 125B --
Line 41, delete "210BA" and insert -- 210B --
Line 67, delete "Stress on silicon the" and insert -- Stress on the --

Column 8
Line 2, delete "125A and be" and insert -- 125A and B --
Line 32, delete "gate" and insert -- a gate --
Line 55, delete "$Si_{(1-X-Y)Gex} C_Y$" and insert -- $Si_{(1-X-Y)}Ge_X C_Y$ --

Column 9
Line 14, delete "tinder" and insert -- under --

Column 10
Line 18, delete "or" and insert -- of --

Signed and Sealed this

Twenty-eighth Day of November, 2006

JON W. DUDAS
*Director of the United States Patent and Trademark Office*